United States Patent [19]

Rapp

[11] Patent Number: 5,274,583
[45] Date of Patent: Dec. 28, 1993

[54] CHARGE-INTEGRATING PREAMPLIFIER FOR FERROELECTRIC MEMORY

[75] Inventor: A. Karl Rapp, Los Gatos, Calif.

[73] Assignee: National Semiconductor Corporation, Santa Clara, Calif.

[21] Appl. No.: 815,468

[22] Filed: Jan. 2, 1992

[51] Int. Cl.$^5$ .................. G06G 7/18; G11C 11/22
[52] U.S. Cl. ......................... 364/829; 365/145
[58] Field of Search ............. 364/829; 333/173, 19, 333/165; 330/9, 107; 365/45, 8, 185, 187.03, 8, 149, 183, 114, 48, 145, 65, 196, 204; 307/490; 340/347 AD; 332/9 R

[56] References Cited

U.S. PATENT DOCUMENTS

| | | | |
|---|---|---|---|
| 4,295,105 | 10/1981 | Bingham | 332/9 R |
| 4,369,501 | 1/1983 | Brown et al. | 365/8 |
| 4,498,063 | 2/1985 | Makabe et al. | 333/173 |
| 4,550,295 | 10/1985 | Sasaki | 333/173 |
| 4,559,498 | 12/1985 | Sokoloff | 333/173 |
| 4,593,381 | 6/1986 | Shariro et al. | 365/45 |
| 4,623,854 | 11/1986 | Kuraishi | 333/173 |
| 4,639,551 | 9/1985 | Fujita | 340/347 AD |
| 4,644,304 | 2/1987 | Temes | 333/173 |
| 4,698,596 | 10/1987 | Haigh et al. | 333/19 |
| 4,761,765 | 8/1988 | Hashimoto | 365/185 |
| 5,084,639 | 1/1992 | Ribner | 307/490 |
| 5,142,496 | 8/1992 | Van Buskirk | 365/185 |
| 5,151,877 | 9/1992 | Brennan | 365/145 |

Primary Examiner—Jerry Smith
Assistant Examiner—Jim Trammell
Attorney, Agent, or Firm—Gail W. Woodward

[57] ABSTRACT

An integrator circuit is connected to a capacitor that is to be measured and the capacitor driven by a read pulse. A first switch grounds the integrator input between read pulses and a second switch applies a bias input to the integrator. The bias is selected so that the integrator is active and its output high. Then, during the read pulse interval, the integrator will hold its input close to ground so that the capacitor to be measured will transfer a maximum charge to the integrator feedback capacitor. Additionally, the stray capacitance at the integrator input has little effect and the output will be a strong function of the value of the capacitor to be measured. The circuit has application in capacitor measurement and is useful as a ferroelectric memory preamplifier which acts to amplify the difference in capacitance produced by the polarization state of a ferroelectric memory capacitor. A CMOS preferred embodiment is disclosed in the form of a memory sense preamplifier.

11 Claims, 2 Drawing Sheets

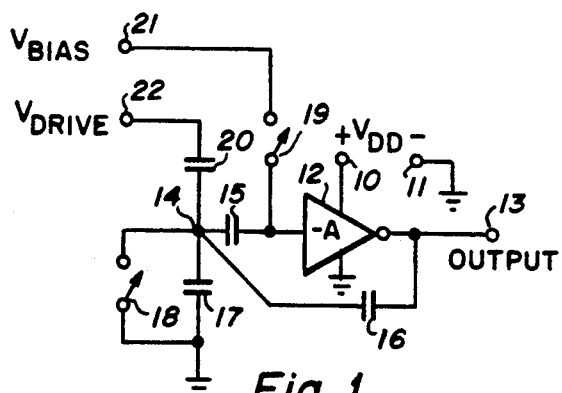
Fig_1
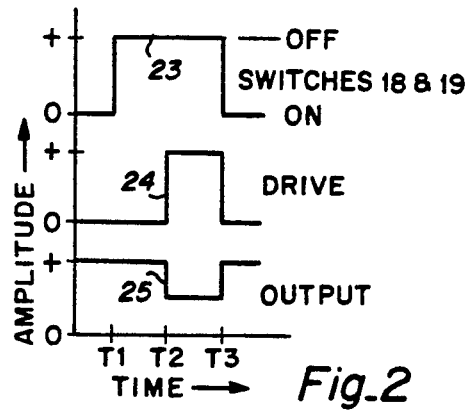
Fig_2
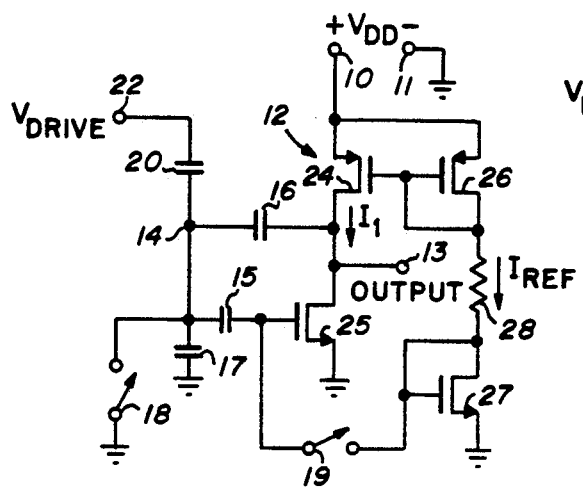
Fig_3
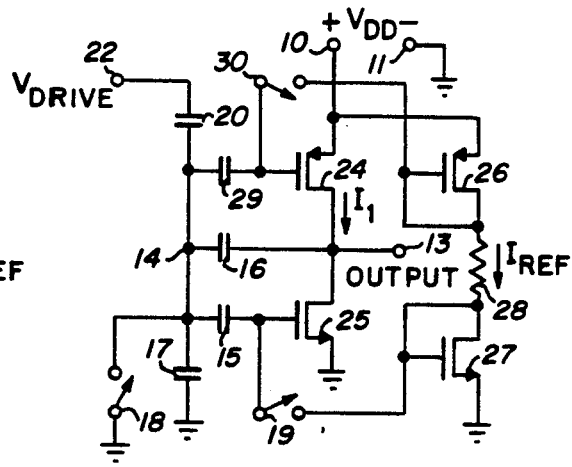
Fig_4
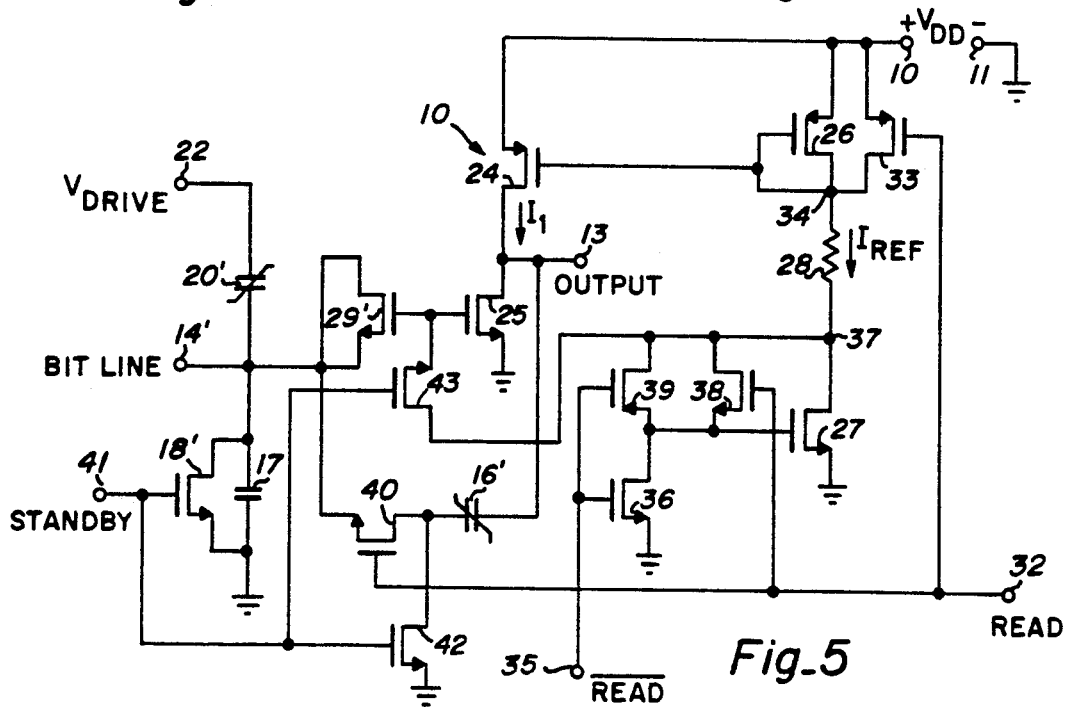
Fig_5

CHARGE-INTEGRATING PREAMPLIFIER FOR FERROELECTRIC MEMORY

BACKGROUND OF THE INVENTION

The invention relates to memory devices that involve the polarization state of a ferroelectric capacitor and is specifically directed to the sensing of the memory state. Since the difference in signal-level between polarization states typically is small in such memories, it is useful to employ a preamplifier to increase the signal levels to values that can easily be handled by conventional sense circuits. While the invention is directed to sensing ferroelectric memory signals, it could be employed in any circuit function that involves responding to the charge transferred by a capacitor. In the memory sensing application, the memory being sensed typically involves a substantial bit-line capacitance.

In a ferroelectric memory array, a selected bit line is coupled to a plurality of ferroelectric-capacitor memory elements, one of which is accessed by a suitable decoder. The selected capacitor is pulsed from a drive line causing a pulse to appear on the bit line. The pulse amplitude is a function of the ferroelectric state of the capacitor dielectric and is determined by the ratio of the memory-capacitor value to the bit-line capacitance. Such a capacitive voltage divider will produce the highest voltage when the memory capacitor is large with respect to the bit line capacitance. However, in order to develop maximum voltage across the memory capacitor, thereby aiding to differentiate between its polarization states, the memory capacitor should be made small with respect to the bit-line capacitance. Thus, a compromise must be made with the typical memory capacitor selected to have a value that approximates the bit-line capacitance. An undesirable constraint thus is imposed on the bit-line length in a large memory array.

In view of the foregoing, it would be desirable to provide a sense amplifier that develops maximum voltage across the ferroelectric capacitor and still provides substantial voltage change at its output. Moreover, if voltage change across the bit-line capacitance can be restricted to a small value, performance can be made insensitive to the size of the bit-line capacitance and thus to bit-line length.

SUMMARY OF THE INVENTION

It is an object of the invention to provide a sense preamplifier that senses and integrates charge instead of voltage and is, therefore, insensitive to stray capacitance.

It is a further object of the invention to employ an integrator coupled to a capacitor whereby a pulse applied to the capacitor produces a charge transfer which is sensed and converted to an output voltage that is closely related to the capacitor value and is insensitive to stray capacitance at the integrator input.

It is a still further object of the invention to provide a sense preamplifier for a ferroelectric memory array wherein the state of a ferroelectric capacitor is sensed during the read operation and the transferred charge converted to an output voltage which is a function of the capacitor dielectric state.

These and other objects are achieved in a circuit configured as follows. An integrator is created by connecting a feedback capacitor between the output of an inverter and the integrator input node which is capacitively coupled to the inverter input. A capacitor to be sensed is also coupled to the integrator input node which can have substantial stray capacitance to ground. A read pulse is applied to the end of the capacitor not connected to the input node so that a charge will be coupled to the input node during the read pulse. The integrator action will prevent the voltage at the input node from rising significantly so that the charge is substantially transferred to the feedback capacitor. The integrator output assumes a voltage that results in charge balancing. Therefore, the output voltage is strongly related to the capacitor value and is relatively insensitive to the stray capacitance at the input node. If the capacitor being sensed is a ferroelectric memory element, the input node can be the bit line in an array. Since the circuit is then insensitive to the bit line capacitance, the memory capacitance size need not be related to the bit line and can be made to have a substantially smaller value. Thus, long bit lines can be accommodated so that large-scale memories are facilitated.

In the preferred embodiment, CMOS construction is employed and applied to a ferroelectric memory. The integrator amplifier is based upon a CMOS inverter which employs an N-channel transistor as the signal coupling element.

The circuit is biased by means of an $I_{REF}$ current, a fraction of which is mirrored in the CMOS inverter. The bias is established prior to the READ pulse and is switched off during the READ pulse. The bias level is set so that the inverter is active and its output close to the positive supply rail. Also, prior to the READ pulse, the input node, which is connected to a memory bit line, is grounded and then released during the READ pulse. Then, during the read pulse, the inverter is active and produces an output that forces the integrator capacitor to absorb the charge passed by the memory capacitor. This action holds the bit line close to ground so that the bit line capacitance has no effect upon the sense operation and the inverter output is a relatively strong function of the memory capacitor, thus sensing its previous polarization state. In the preferred embodiment, both the memory capacitor and the integrator capacitor are ferroelectric devices and means are provided to short circuit both when the circuit is not active.

BRIEF DESCRIPTION OF THE DRAWING

FIG. 1 is a block-schematic diagram of a circuit which will produce an output closely related to the value of a capacitor.

FIG. 2 is a graph showing the control signals used to operate the circuit of FIG. 1.

FIG. 3 is a schematic diagram of a CMOS version of the circuit of FIG. 1.

FIG. 4 is a schematic diagram of an alternative CMOS circuit.

FIG. 5 is a schematic diagram of the preferred embodiment of the invention.

DESCRIPTION OF THE INVENTION

Figure 6:
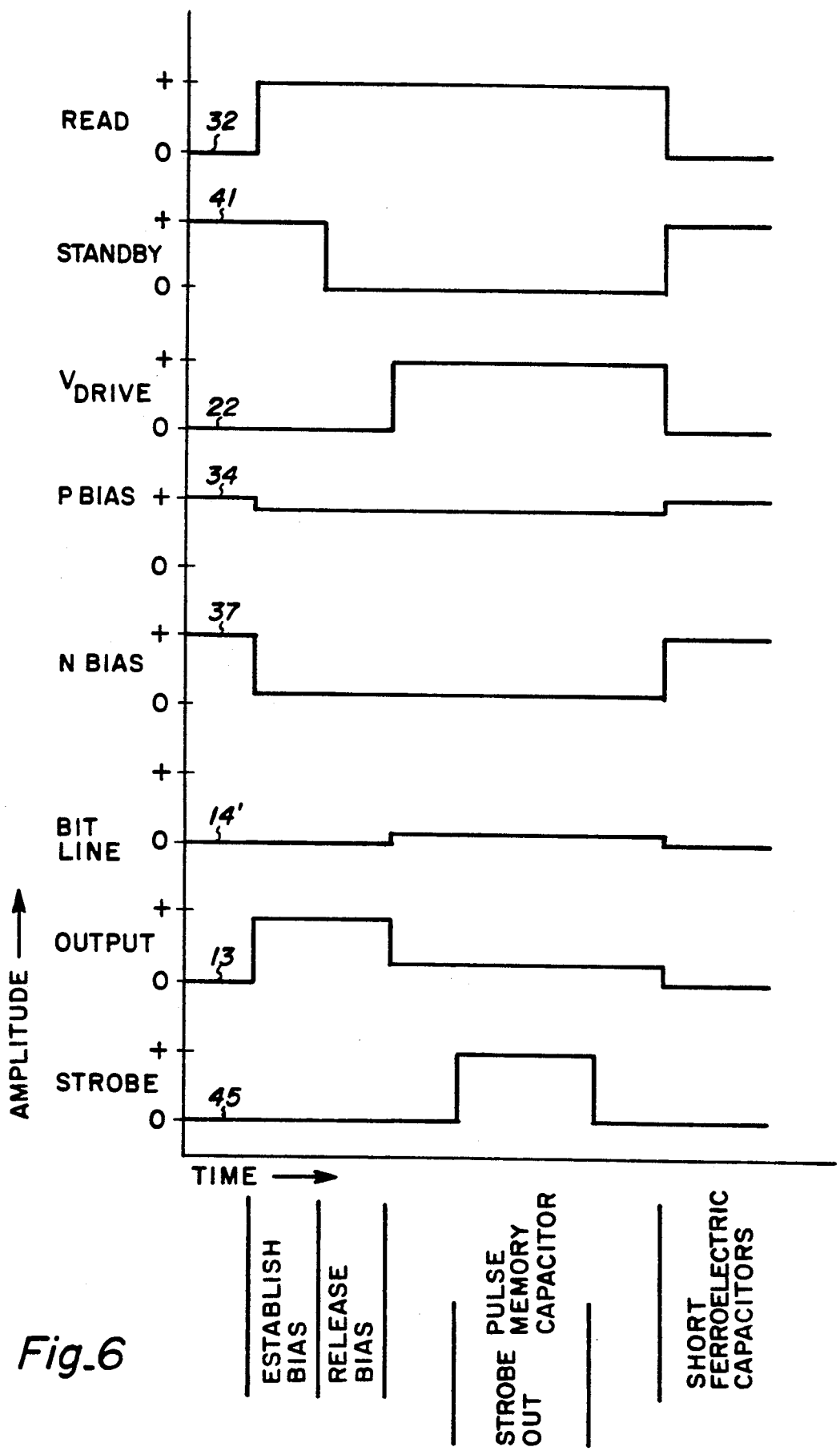
FIG. 6 is a graph showing the control signals used to operate the circuit of FIG. 5.

FIG. 1 is a block-schematic diagram of the circuit of the invention illustrating its basic concepts. The circuit operates from a $V_{DD}$ power supply connected + to terminal 10 and − to ground terminal 11. The heart of the circuit is inverting amplifier 12, which drives output terminal 13 and has an input at node 14. The input is capacitively coupled via capacitor 15 which is large enough to couple substantially all of the potential change at node 14.

Capacitor 16, which is coupled between output terminal 13 and input node 14, converts the inverting amplifier into an integrator. In effect, the gain of the amplifier results in a large so-called Miller-effect capacitance to ground at the input node. The Miller capacitance is determined by:

$C_M = C_{16}(A+1)$ where:

$C_M$ is the effective input Miller capacitance and A is the gain of amplifier 12. Capacitor 17 is the circuit stray capacitance at node 14. Capacitor 20 is the capacitor whose value is to be determined. Switches 18 and 19 remain closed while the circuit is inactive. Thus, node 14 is normally grounded and the input of amplifier 12 is returned to $V_{BIAS}$ terminal 21. Capacitor 20 is driven from $V_{DRIVE}$ terminal 22 which is normally low.

FIG. 2 is a graph which shows the two control waveforms and the output response of the circuit of FIG. 1. Switches 18 and 19 are operated by waveform 23 so that they are open when the waveform is high and closed when the waveform is low. Thus, in the inactive interval prior to T1, when switches 18 and 19 are both closed, input node 14 is grounded, thereby discharging capacitor 17. Also, since switch 19 returns the input of amplifier 12 to $V_{BIAS}$ terminal 21, capacitor 15 will be charged to the $V_{BIAS}$ level. This level is chosen to operate amplifier 12 at the positive end of its linear range. Amplifier 12 thus is operable and its output is high. Capacitor 16 is charged to the potential at terminal 13.

At time T1, switches 18 and 19 are opened and amplifier 12 becomes a functional Miller effect integrator that acts to hold input node 14 at ground as described above. Then, at time T2, waveform 24 drives capacitor 20 at terminal 22, causing capacitor 20 to attempt to pull up node 14. However, any increase of potential at node 14 is applied to the input of amplifier 12, causing its output to be forced lower to minimize the change at node 14. Thus, at time T2, terminal 13 will seek a value that is related to the size of capacitor 20.

It is apparent that the change in charge for capacitor 20 in the time interval T2-T3 will equal the sum of the change in charges on capacitors 17 and 16. Therefore $$\Delta Q_{20} + \Delta Q_{17} + \Delta Q_{16}$$

where the $\Delta Q$ values are the change in charge for the associated capacitor. This translates into $$(V_{DRIVE} - V_{14})C_{20} = V_{14}C_{17} + (V_{14} - V_{OUTPUT})C_{16}$$

where $V_{14}$ is the voltage at node 14. Designating the gain of the amplifier by $(-A)$, $V_{OUTPUT}$ is related to the input voltage $V_{14}$ by $$V_{OUTPUT} = -A V_{14}$$

Then, substituting into the charge equation, the output voltage is given by $$V_{OUTPUT} = \frac{-A C_{20} V_{DRIVE}}{C_{17} + C_{20} + (1+A) C_{16}}$$

and for large values of gain for amplifier 12, the relationship simplifies to $$V_{OUTPUT} \approx -\frac{C_{20}}{C_{16}} V_{DRIVE}$$

Since capacitor 16 is of a known value, the value of capacitor 20 can be determined by the output voltage at terminal 13. It can be seen that an effective means for determining small changes in the value of capacitor 20 is available.

FIG. 3 shows how the FIG. 1 embodiment can be implemented in CMOS. A biasing circuit is included. The circuit of FIG. 3 also is operated by the FIG. 2 waveforms. Amplifier 12 is composed of a CMOS inverter, employing transistors 24 and 25. Their commonly-connected drains comprise output terminal 13. Transistors 26 and 27 have their gates returned to their drains and with resistor 28 are connected between the power supply terminals so that $I_{REF}$ flows in the series combination. Transistor 24 attempts to mirror the current in transistor 26 and, when switch 19 is closed, the current in transistor 25 attempts to mirror the current in transistor 27. Scaling of transistor sizes controls the current $I_1$ that flows through transistors 24 and 25 and sets the voltage at output node 13.

Transistors 24 through 27, are ratioed so that $I_1$ is a controlled fraction of $I_{REF}$ and output node 13 is at the positive end of its linear range. The bias circuit can serve a plurality of amplifier circuits simultaneously. The performance of the circuit of FIG. 3 is otherwise the same as that described for FIG. 1 and the waveforms of FIG. 2 apply as explained above.

FIG. 4 is an alternative embodiment for the circuit of FIG. 3. A second coupling capacitor 29 has been added to drive P channel transistor 24 in the conventional CMOS inverter practice. Switch 30 has been added to control the bias on transistor 24. Switches 18, 19 and 30 are operated simultaneously by waveform 23 of FIG. 2. The circuit of FIG. 4, therefore, operates substantially the same as that of FIG. 3.

FIG. 5 is a schematic diagram of the preferred embodiment of the invention using CMOS circuitry in conjunction with a ferroelectric memory. As shown, capacitors 16' and 20' are both ferroelectric devices. It is to be understood that terminal 14' represents the memory bit line and capacitor 17 is the bit line capacitance. Where the circuit components are as was described in previous figures, the same numerals are employed and the functions are the same. However, a number of additional control elements have been added. FIG. 6 is a graph illustrating the applied signals for the operation of the circuit of FIG. 5 and should be consulted in the following description.

The READ pulse 32 of FIG. 6 controls powering up of the bias generator. In the powered-down interval proceding time TO, the READ pulse is low thereby turning P channel transistor 33 on. This pulls the P bias node 34 up close to + supply line 10. Accordingly, transistors 24 and 26 are turned off. The $\overline{READ}$ control at terminal 35 will be high thereby turning N channel transistor 36 on, which turns transistor 27 off. Thus, N bias node 37 will be pulled high or close to the + supply line 10. Since terminal 32 is low, N channel transistor 38 is off and since terminal 35 is high P channel transistor 39 is off. Likewise, N channel transistor 40 is off.

Also, during the time prior to TO, STANDBY terminal 41 is high thus turning N channel transistors 18', 42 and 43 on. Transistor 18' grounds bit line 14', transistor 42 grounds the juncture of capacitor 18' and transistor 40, and transistor 43 couples the bias at node 37 to the gate of transistor 25 turning transistor 25 on. $V_{DRIVE}$ control 22 is at ground potential. As a result of these conditions, both plates of ferroelectric capacitors 16' and 20' are at ground potential. Thus, while the circuit is inactive, no voltage exists across the ferroelectric capacitor.

At T0, READ terminal 32 goes high and remains high to T3. This action turns transistor 33 off and transistor 38 on. The $\overline{READ}$ at terminal 35, being low, turns transistor 36 off and transistor 39 on. The turning off of transistor 33 allows the potential at node 34 to drop thereby establishing the current-mirror bias for transistor 24. Transistors 38 and 39 are turned on to connect the gate of transistor 27 to its drain to produce current-mirror bias for transistor 25. This bias is conducted by transistor 43. Transistor 25 is turned on sufficiently to conduct $I_1$, but not to the extent to pull output-terminal 13 low. Thus, in the interval T0 to T1, amplifier 10 is energized and its operating bias allowed to stabilize. The positive $\overline{READ}$ pulse also turns on transistor 40, thereby connecting bit-line 14 to the feedback capacitor 16.

Then at T1, the STANDBY terminal 41 goes low, thereby turning transistors 18', 42 and 43 off. This action removes the clamp from bit line 14' and disconnects the gate of transistor 25 from its bias source node 37. This state is allowed to stabilize.

At time T2 the $V_{DRIVE}$ waveform 22 is applied and terminal 22 goes high. This action writes a logic zero into memory-capacitor 20' which couples a charge into bit line 14'. The charge pulls the bit line up slightly which causes output terminal to fall, as seen in waveform 13, to a value that will cause capacitor 16' to transfer a charge to the bit line that will offset the charge coupled by capacitor 20'. The net result is that the bit-line potential moves only a small amount while the output terminal provides a significant swing in potential. In other words, the bit line is held close to ground during the $V_{DRIVE}$ pulse, but the slight voltage change is greatly amplified to provide a useful output signal.

During the T2–T3 interval, the state of the memory capacitor can be determined. If capacitor 20' previously had a logic zero written into it, the action of the $V_{DRIVE}$ pulse will produce a nominal output of waveform 13. However, if capacitor 20' had previously been written as a logic one, the action of the $V_{DRIVE}$ pulse will result in a slightly greater charge transferred to bit line 14'. The resulting slightly higher potential will lower the potential at terminal 13 with the difference being significantly easier to detect. Thus, the circuit of FIG. 5 provides a memory sense preamplifier function.

While not disclosed in FIG. 5, a conventional strobe circuit can be employed to read out the amplified memory state inside the T2–T3 time interval. In FIG. 6, waveform 45 shows a suitable strobe pulse. The strobe output will indicate a positive voltage level at terminal 13 for a memory logic zero. For a logic one the output is significantly lower. Thus, it is relatively easy to sense the logic state.

At time T3 the $\overline{READ}$ pulse at terminal 32 goes low, the STANDBY pulse at terminal 41 goes high and the $V_{DRIVE}$ at terminal 22 goes low. These actions turn transistors 18', 33, 36, 42 and 43 on while turning off transistors 38, 39 and 40. Since terminal 22 is low and transistor 18' on, it can be seen that after T3, capacitor 20' is fully discharged. Since node 37 is high and transistor 43 on, transistor 25 will be turned on and will pull output terminal 13 low. Since transistor 42 is on, it can be seen that capacitor 16' is also fully discharged. Thus, the ferroelectric capacitors are shorted and fully discharged after T3 on each operating cycle.

EXAMPLE

The circuit of FIG. 5 was simulated using the following CMOS device sizes.

| TRANSISTORS | SIZES W/L in MICRONS |
| --- | --- |
| 18, 36, 38, 39, 40, 42, 43 | 2.6/1 |
| 24 | 10.4/2 |
| 25 | 10.4/1 |
| 26 | 40/2 |
| 27 | 80/1 |
| 29' | 5.2/30 |
| 33 | 10/1 |

Resistor 28 was 700 ohms so that $I_{REF}$ was about 1.0 ma. at a $V_{DD}$ supply voltage of 5 volts. Amplifier 10 had a gain of about 15. Capacitors 16' and 20' were each about 0.2 pf. The bit line capacitance was 1 pf which gives a bit line to memory ratio of 5. In operation, the bit line rose to about 0.30 volt for a logic zero on capacitor 20' and for a logic 1 rose to about 0.33 volt, thus showing that the circuit acted to substantially suppress bit line swing. This produced a 0.5 volt differential at terminal 13.

The invention has been described and a preferred embodiment detailed. Alternatives have also been described. When a person skilled in the art reads the foregoing description, still other alternatives and equivalents, within the spirit and intent of the invention, will be apparent. Accordingly, it is intended that the scope of the invention be limited only by the claims that follow.

I claim:

1. A charge integrating preamplfier having an input for responding to the charge passed by a first capacitor in response to an applied pulse thereby producing an output that is related to the value of said first capacitor said preamplifier comprising:

an integrator composed of an inverting amplifier having a feedback capacitor coupled between said amplifier output and input;

a circuit node comprising the point of connection between said first capacitor and said integrator, said circuit node having substantial stray capacitance;

first switch means connected between said circuit node and a source of reference potential, said first switch means being operated in an open state during said applied pulse;

second switch means connected to said integrator to apply a bias potential thereto when said second switch means is turned on, said second switch means being in an open state during said applied pulse; and means for operating said first and second switch means whereby said output is related to the charge on said first capacitor and is not affected by said stray capacitance.

2. The charge integrating preamplifier of claim 1 wherein said inverting amplifier is coupled by means of a coupling capacitor to said circuit node and said second switch means is connected to the juncture of said coupling capacitor and said inverting amplifier.

3. The charge integrating preamplifier of claim 2 wherein said applied pulse is positive and said bias potential is selected to bias said amplifier into the high output active region.

4. The charge integrating preamplifier of claim 2 wherein said inverting amplifier comprises a pair of complementary MOS transistors, the drains of which are connected together to form said preamplifier output.

5. The charge integrating preamplifier of claim 4 wherein said bias voltage is developed by passing a reference current through an MOS transistor having its gate connected to its drain thereby to develop a reference voltage.

6. The charge integrating preamplifier of claim 5, in association with a ferroelectric memory array in which said first capacitor has a ferroelectric dielectric, said applied pulse is the memory array read pulse and said circuit node constitutes a bit line in said memory array.

7. The charge integrating preamplifier of claim 6 wherein said feedback capacitor also has a ferroelectric dielectric.

8. The charge integrating preamplifier of claim 7 wherein said first capacitor and said feedback capacitors have substantially the same capacitance.

9. The charge integrating preamplifier of claim 8 further including means for shorting said first and said feedback capacitors when said first and second switch means are closed.

10. The charge integrating preamplifier of claim 5 wherein said first and second switches and said coupling capacitor are N channel MOS transistors.

11. The charge integrating preamplifier of claim 5 wherein said reference current is made large with respect to the current flowing in said pair of complementary MOS transistors and one bias voltage developing circuit can simultaneously bias a plurality of charge integrating preamplifiers.

* * * * *